United States Patent
Tsai et al.

(10) Patent No.: US 11,718,767 B2
(45) Date of Patent: Aug. 8, 2023

(54) CHEMICAL MECHANICAL PLANARIZATION COMPOSITION FOR POLISHING OXIDE MATERIALS AND METHOD OF USE THEREOF

(71) Applicant: Versum Materials US, LLC, Tempe, AZ (US)

(72) Inventors: Ming-Shih Tsai, Hsinchu (TW); Chia-Chien Lee, Hsinchu (TW); Rung-Je Yang, Hsinchu (TW); Anu Mallikarjunan, Hsinchu (TW); Chris Keh-Yeuan Li, Hsinchu (TW); Hongjun Zhou, Chandler, AZ (US); Joseph D. Rose, Gilbert, AZ (US); Xiaobo Shi, Chandler, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 16/533,381

(22) Filed: Aug. 6, 2019

(65) Prior Publication Data

US 2020/0048551 A1    Feb. 13, 2020

Related U.S. Application Data

(60) Provisional application No. 62/716,769, filed on Aug. 9, 2018, provisional application No. 62/716,784, filed on Aug. 9, 2018.

(51) Int. Cl.

| | | |
|---|---|---|
| *C09G 1/02* | (2006.01) | |
| *C09K 13/00* | (2006.01) | |
| *H01L 21/3105* | (2006.01) | |
| *H01L 21/321* | (2006.01) | |
| *H01L 21/306* | (2006.01) | |
| *C09K 3/14* | (2006.01) | |
| *B24B 37/04* | (2012.01) | |
| *B24B 1/00* | (2006.01) | |
| *C09G 1/06* | (2006.01) | |
| *C09G 1/04* | (2006.01) | |
| *C09G 1/00* | (2006.01) | |
| *C09K 13/04* | (2006.01) | |

(52) U.S. Cl.
CPC .................. *C09G 1/02* (2013.01); *B24B 1/00* (2013.01); *B24B 37/044* (2013.01); *C09G 1/00* (2013.01); *C09G 1/04* (2013.01); *C09G 1/06* (2013.01); *C09K 3/1454* (2013.01); *C09K 3/1463* (2013.01); *C09K 13/00* (2013.01); *H01L 21/30625* (2013.01); *H01L 21/31053* (2013.01); *H01L 21/3212* (2013.01); *C09K 13/04* (2013.01)

(58) Field of Classification Search
CPC ...... C09K 13/04; C09K 13/00; C09K 3/1436; C09K 3/1463; C09G 1/02; H01L 21/31053; H01L 21/3212; H01L 21/30625; B24B 37/044

See application file for complete search history.

(56) References Cited

U.S. PATENT DOCUMENTS

| | | | | |
|---|---|---|---|---|
| 6,616,514 B1 * | 9/2003 | Edelbach | ................. | C09G 1/02 |
| | | | | 216/89 |
| 2002/0098697 A1 * | 7/2002 | Shimazu | ................. | C09G 1/02 |
| | | | | 438/691 |
| 2004/0033764 A1 * | 2/2004 | Lee | ....................... | C09G 1/02 |
| | | | | 451/36 |
| 2004/0152309 A1 * | 8/2004 | Carter | .................... | C03C 19/00 |
| | | | | 438/689 |
| 2006/0219663 A1 * | 10/2006 | Wang | ........................ | C23F 3/06 |
| | | | | 216/88 |
| 2006/0246723 A1 * | 11/2006 | Park | ........................ | C09G 1/02 |
| | | | | 438/692 |
| 2007/0270085 A1 | 11/2007 | Ota et al. | | |
| 2013/0244433 A1 | 9/2013 | Reiss et al. | | |
| 2014/0099790 A1 | 4/2014 | Shi et al. | | |
| 2016/0096979 A1 * | 4/2016 | Lan | ......................... | C09G 1/02 |
| | | | | 216/52 |
| 2016/0358790 A1 * | 12/2016 | Shi | ............................ | C09G 1/02 |
| 2017/0133236 A1 | 5/2017 | Murella et al. | | |
| 2017/0283673 A1 * | 10/2017 | Zhou | .................... | C09K 3/1409 |
| 2019/0153279 A1 * | 5/2019 | Tawarazako | ............. | C09G 1/02 |
| 2019/0241766 A1 | 8/2019 | Doi | | |
| 2019/0367777 A1 * | 12/2019 | Komatsu | ............... | H01L 21/304 |
| 2020/0024481 A1 * | 1/2020 | Doi | ...................... | C09K 3/1454 |

FOREIGN PATENT DOCUMENTS

| | | | |
|---|---|---|---|
| EP | 3101076 A1 | 12/2016 | |
| EP | 3231848 A1 | 10/2017 | |
| EP | 3476910 A1 | 5/2019 | |
| JP | 2005285944 A | 10/2005 | |

(Continued)

OTHER PUBLICATIONS

Cook, Lee M., et al., "Chemical Processes in Glass Polishing", Journal of Non-Crystalline Solids, 120 (1990), pp. 152-171.

Na, H. S., et al., "Characteristics of Sapphire Wafers Polishing Depending on Ion Conductivity of Silica Sol", Korean Journal of Materials Research, Jan. 27, 2015, vol. 25, No. 1, pp. 21-26.

(Continued)

*Primary Examiner* — Jiong-Ping Lu
(74) *Attorney, Agent, or Firm* — Lina Yang

(57) ABSTRACT

Polishing compositions comprising ceria coated silica particles and organic acids having one selected from the group consisting of sulfonic acid group, phosphonic acid group, pyridine compound, and combinations thereof, with pH between 5 and 10 and electrical conductivity between 0.2 and 10 millisiemens per centimeter provide very high silicon oxide removal rates for advanced semiconductor device manufacturing.

15 Claims, No Drawings

(56) References Cited

FOREIGN PATENT DOCUMENTS

| | | | | |
|---|---|---|---|---|
| JP | 2009218558 | | 9/2009 | |
| JP | 2017193692 | | 10/2017 | |
| JP | 6563957 | * | 8/2019 | ............. B24B 37/00 |
| KR | 20170076058 | * | 7/2017 | ............... C09G 1/02 |
| WO | 2010149434 A1 | | 12/2010 | |
| WO | 2015019911 A1 | | 2/2015 | |
| WO | 2016140968 A1 | | 9/2016 | |
| WO | WO2017183452 | * | 10/2017 | ........... H01L 21/304 |

OTHER PUBLICATIONS

Seiwa Patent & Law; Japanese Patent Application No. 2019-147737; Search; Letter dated May 2, 2023; p. 4.

* cited by examiner

CHEMICAL MECHANICAL PLANARIZATION COMPOSITION FOR POLISHING OXIDE MATERIALS AND METHOD OF USE THEREOF

CROSS REFERENCE TO RELATED APPLICATION(S)

This application claims the benefit of U.S. Provisional Patent Application No. 62/716,784 and U.S. Provisional Patent Application No. 62/716,769, both filed on Aug. 9, 2018, which are incorporated herein by reference as if fully set forth.

BACKGROUND

This application relates to chemical mechanical planarization/polishing ("CMP") compositions (CMP slurries, CMP compositions or CMP formulations are used interchangeably) used in the production of semiconductor devices, and polishing methods for carrying out chemical mechanical planarization. In particular, it relates to polishing compositions comprising composite abrasive particles that are suitable for polishing patterned semiconductor wafers composed of oxide materials.

Silicon oxide (silica) is widely used as a dielectric material in the semiconductor industry. There are several CMP steps in the integrated circuit (IC) manufacturing process, such as shallow trench isolation (STI), inter-layer dielectric (ILD) CMP and gate poly CMP, for example. Typical oxide CMP slurry comprises an abrasive, with or without other chemicals. The other chemicals include dispersants to improve slurry stability, boosters to increase removal rate, and inhibitors to decrease removal rate and to stop polishing when a stopper layer is reached, for example, SiN in STI applications.

Common abrasives used in CMP slurries include, but are not limited to, silica, alumina, zirconia, titania and ceria. Ceria is well-known for its high reactivity toward silica. Ceria is widely used in STI CMP slurry to provide the greatest oxide removal rate (RR) due to is high reactivity to silica.

Cook et al. (Lee M. Cook, Journal of Non-Crystalline Solids 120 (1990) 152-171) proposed a 'chemical tooth' mechanism to explain this extraordinary property of ceria. According to this mechanism, when ceria particles are pressed onto silicon oxide film, ceria breaks down silica bonds, forms a Ce—O—Si structure, and thus cleaves silica from the surface.

As semiconductor technology has evolved, there are new applications that demand innovative CMP solutions to provide high silicon oxide removal rates and a high degree of planarity. One such application is manufacturing three-dimensional (3D) memory structures. 3D memory structures stack the memory cells vertically, allowing a wider gap between each cell, to overcome patterning restrictions. For example, 3D NAND memory structures typically use alternating layers of thick oxides and nitride, or oxide and conductor layers, to form vertical NAND structures in the form of a staircase. In these applications, oxide layers are typically thicker than 3 microns. In order to maintain throughput requirements, oxide layers must be polished at very high rates, as disclosed in US2017133236.

Therefore, there are significant needs for CMP compositions, methods, and systems that can provide high removal rates of silicon oxide, high planarization efficiency and excellent slurry stability.

BRIEF SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Disclosed embodiments, as described below and as defined by the claims which follow, comprise CMP polishing compositions for polishing oxide material, and related methods and systems, that satisfy the need for polishing semiconductor wafers comprising silicon oxide structures at very high removal rates.

The disclosed embodiments satisfy the need in the art by providing compositions, methods and systems that allow high removal rates of silicon oxide when polishing semiconductor wafers, high planarization efficiency and excellent slurry stability. For example, an embodiment satisfies the need for polishing semiconductors at silicon oxide removal rates of greater than 10000 Angstroms/minute. Preferred embodiments satisfy the need for polishing semiconductors at silicon oxide removal rates of greater than 12500 Angstroms/minute, or greater than 15000 Angstroms/minute, during polishing at 4 psi downforce and 126 RPM table speed with 150 ml/min slurry flow rate on a 300 mm wafer polisher. Formulations disclosed in this application are especially useful for polishing semiconductor wafers for 3D-NAND memory structure applications.

Embodiments of the CMP slurry formulations described herein comprise abrasive particles, a silicon oxide removal rate accelerator and a solvent. The CMP slurry formulations may optionally comprise additives for pH and conductivity adjustment, biological growth inhibition, surfactants, dispersants, and functional additives such as chemicals for suppression of stopper films.

Preferred abrasives include, but are not limited to, composite ceria abrasives formulated with a $SiO_2$ (silica) core that is covered with fine ceria abrasive particles forming a shell. Preferred silicon oxide removal rate accelerators include, but are not limited to, salts, such as salts of nitrate, phosphate, phosphonates, sulphate, sulphonates, carboxylate or combinations thereof, corresponding acids such as nitric, sulfonic, sulfuric, phosphonic, phosphinic, carboxylic or combinations thereof. Preferably the slurry formulation has a pH of 7 to 11 which is preferably adjusted using a suitable acid or base including, but not limited to, HNO3 and NH4OH. Preferably, the slurry formulation has a conductivity 0.3-9 mS/cm.

In addition, several specific aspects of the systems and methods of the subject matter disclosed herein are outlined below.

Aspect 1: A chemical mechanical planarization (CMP) composition for polishing oxide material comprising:
an abrasive selected from the group consisting of inorganic oxide particles, doped inorganic oxide particles, surface coated composite inorganic oxide particles, organic polymer particles, inorganic oxide coated organic polymer particles, and combinations thereof;
a removal rate accelerator; and
a solvent;
wherein the composition further comprises a pH greater than 5.

Aspect 2: The CMP composition of Aspect 1, wherein the abrasive is selected from the group consisting of cerium oxide (ceria), aluminum oxide, zirconium oxide, zirconium silicate, tin oxide, silicon dioxide, titanium oxide, germanium oxide, vanadium oxide, doped inorganic oxide, composite inorganic oxide and combinations thereof.

Aspect 3: The CMP composition in Aspect 2, wherein the abrasive comprises cerium oxide selected from the group consisting of calcined ceria, colloidal ceria, ceria coated silica particles, and combinations thereof.

Aspect 4: The CMP composition of Aspect 3, wherein the abrasive comprises ceria coated silica particles, the ceria coated silica particles comprising an amorphous silica core particle coated with crystalline ceria nanoparticles.

Aspect 5: The CMP composition of Aspect 4, wherein the crystalline ceria nanoparticles comprise a single crystal.

Aspect 6: The CMP composition of Aspect 4, wherein a weight ratio of the ceria nanoparticles to the amorphous silica core particle is 0.01 to 1.5 or greater.

Aspect 7: The CMP composition of Aspect 4, wherein the amorphous silica core particles comprise a diameter ranging from 20 to 550 nanometers and the ceria nanoparticles comprise a diameter greater than 10 nanometers, wherein the diameter of the amorphous silica core particles is greater than the diameter of the ceria nanoparticles.

Aspect 8: The CMP composition of any of Aspects 1-7, wherein the removal rate accelerator is an organic acid or an organic acid salt having one selected from the group consisting of a sulfonic acid group, a phosphonic acid group, a pyridine group, and combinations thereof.

Aspect 9: The CMP composition of any of Aspects 1-8, wherein the removal rate accelerator is a salt selected from the group consisting of nitrate, phosphate and sulphate.

Aspect 10: The CMP composition in any of Aspects 1-9, wherein the solvent is selected from the group consisting of water, a polar non-aqueous solvent, and a mixture thereof.

Aspect 11: The CMP composition in Aspect 10, wherein the non-aqueous solvent is selected from the group consisting of alcohol, ether, ketone and combinations thereof.

Aspect 12: The CMP composition of any of Aspects 1-11, wherein the removal rate accelerator is an acid selected from the group consisting of nitric, sulphonic, sulfuric, phosphonic, carboxylic and combinations thereof.

Aspect 13: The CMP composition of any of Aspects 1-12 wherein the removal rate accelerator is an acid selected from the group consisting of phenyl phosphonic acid, benzoic acid, acetic acid, malonic acid glutaric acid, oxalic acid and combinations thereof.

Aspect 14: The CMP composition of any of Aspects 1-13, wherein the removal rate accelerator is a sulfonic acid selected from the group consisting of methanesulfonic acid, benzenesulfonic acid, toluene sulfonic acid, p-toluene sulfonic acid, ethane di sulfonic acid, naphthalene di sulfonic acid, acrylamido propane sulfonic acid, morpholinopropanesulfonic acid, 3-(N-Morpholino)propanesulfonic acid (MOPS), 4-Morpholineethanesulfonic acid (MES), beta-Hydroxy-4-morpholinepropanesulfonic acid (MOPSO), 4-(2-Hydroxyethyl)piperazine-1-ethanesulfonic acid (HEPES), 1,4-piperazinediethanesulfonic acid (PIPES), piperazine-1,4-bis(2-hydroxypropanesulfonic acid)dihydrate (POPSO), 4-(2-Hydroxyethyl)-1-piperazinepropanesulfonic acid (EPPS), piperazinediethane sulfonic acid, hydroxyethylpiperazine ethane sulfonic acid, and combinations thereof.

Aspect 15: The CMP composition in Aspect 8, wherein the removal rate accelerator is an organic acid having a pyridine group having a structure of:

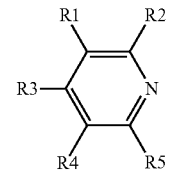

wherein R1, R2, R3, R4 and R5 are independently selected from the group consisting of hydrogen, a carboxylic acid, a carboxylic acid ester, an organic sulfonic acid, an organic amine, an organic amide and a hydroxyl group.

Aspect 16: The CMP composition in Aspect 15, wherein at least one of R1, R2, R3, R4 and R5 is a carboxylic acid.

Aspect 17: The CMP composition of any of Aspects 1-16, wherein the removal rate accelerator is a pyridine compound selected from the group consisting of: pyridine; pyridine monocarboxylic acid; pyridine dicarboxylic acid; picolinic acid; nicotinic acid; isonicotinic acid; dipicolinic acid; 2,5-pyridinedicarboxylic acid; 3,5-pyridinedicarboxylic acid; 2,3-pyridinedicarboxylic acid; and 3,4-pyridinedicarboxylic acid.

Aspect 18: The CMP composition of any of Aspects 1-17, wherein a pH of the CMP composition ranges from 7 to 11.

Aspect 19: The CMP composition of any of Aspects 1-18, wherein a conductivity of the CMP composition ranges from 0.3 to 9 millisiemens per centimeter.

Aspect 20: The CMP composition of any of Aspects 1-19, wherein the composition comprises at least one additive selected from the groups consisting of an additive for removal rate selectivity, a pH adjuster, a surfactant, a dispersant, and a biological growth inhibitor.

Aspect 21: The CMP composition in any of Aspects 1-20, wherein the abrasive comprises particles having a zeta potential more negative than −25 millivolts.

Aspect 22: A polishing method for chemical mechanical planarization (CMP) of a semiconductor device comprising a first material and a second material, comprising the steps of:

(a) contacting at least one surface of the first material with a CMP polishing pad;

(b) delivering the CMP polishing composition in any of Aspects 1-21 to the at least one surface;

(c) polishing the at least one surface with the polishing composition to remove the first material at a removal rate of greater than 10000 Angstroms/minute.

Aspect 23: The polishing method of Aspect 22, wherein the first material is a silicon oxide material selected from the group consisting of thermal oxide, TEOS films deposited using Tetra Ethyl Ortho Silicate (TEOS) precursors, High Density Plasma (HDP) oxide, High Aspect Ratio Process (HARP) films, fluorinated oxide films, doped oxide films, Spin-On Glass (SOG), flowable Chemical Vapor Deposited (CVD) films, optical glass, display glass, and combinations thereof.

Aspect 24: The polishing method of Aspect 23, wherein the second material is selected from the group of silicon nitride, polysilicon, and combinations thereof.

Aspect 25: A system for chemical mechanical planarization, comprising:
(a) a patterned substrate comprising at least one surface having a first material and a second material;
(b) a polishing pad; and
(c) the CMP polishing composition in any of Aspects 1-21;
wherein the at least one surface is in contact with the polishing pad and the polishing composition and the first material is a silicon oxide material selected from the group consisting of thermal oxide, TEOS films deposited using Tetra Ethyl Ortho Silicate (TEOS) precursors, High Density Plasma (HDP) oxide, High Aspect Ratio Process (HARP) films, fluorinated oxide films, doped oxide films, Spin-On Glass (SOG), flowable Chemical Vapor Deposited (CVD) films, optical glass, display glass, and combinations thereof.

DETAILED DESCRIPTION

The ensuing detailed description provides preferred exemplary embodiments only, and is not intended to limit the scope, applicability, or configuration of the claimed invention. Rather, the ensuing detailed description of the preferred exemplary embodiments will provide those skilled in the art with an enabling description for implementing the preferred exemplary embodiments. Various changes may be made in the function and arrangement of elements without departing from the spirit and scope of the invention, as set forth in the appended claims.

All terms defined herein should be afforded their broadest possible interpretation, including any implied meanings as dictated by a reading of the specification as well as any words that a person having skill in the art and/or a dictionary, treatise, or similar authority would assign particular meaning. Further, it should be noted that, as recited in the specification and in the claims appended hereto, the singular forms "a," "an," and "the" include the plural referents unless otherwise stated. Additionally, the terms "comprises" and "comprising" when used herein specify that certain features are present in that embodiment, but should not be interpreted to preclude the presence or addition of additional features, components, operations, and/or groups thereof.

Disclosed herein are CMP polishing compositions for polishing oxide material, and related methods and systems, that satisfy the need for polishing semiconductor wafers comprising silicon oxide structures at very high removal rates.

The CMP slurry formulations described herein comprise an abrasive, also referred to herein as abrasive particles, one or more additives that accelerate the removal rate of silicon oxide films and a solvent. The CMP slurry formulations may optionally comprise additives for pH adjustment, conductivity adjustment, biological growth inhibition, surfactants, dispersants, and functional additives such as chemicals for suppression of stopper films.

The paragraph headings that follow are solely to provide organization to the disclosure and are not intended to limit the scope of the claimed invention in any way.

Abrasive

The abrasive, also referred to herein as abrasive particles, may comprise one or more metal oxide, one or more metalloid oxide or a chemical mixture of metal oxides and metalloid oxides. Preferred abrasives include, but are not limited to, inorganic oxide particles, doped inorganic oxide particles, composite inorganic oxide particles, organic polymer particles, inorganic oxide coated organic polymer particles, or combinations thereof.

Abrasive particles may have different chemical and physical forms including, but not limited to, chemically homogeneous, doped, surface modified, and core-shell with continuous or discontinuous shell layers.

As used herein, "doped" inorganic oxide particles refers to abrasive particles in which secondary inorganic metal ions (in metal oxide form) are intentionally introduced into a structure of the primary metal ions. For example, ceria may be doped with lanthanum or another secondary metal ion. The secondary metal ion is introduced and uniformly distributed in the original material structure (a lattice if it is crystal). Doped abrasives maintain a single phase before and after doping.

As used herein, "composite" inorganic oxide particles refer to two metal oxides connected to each other either physically or chemically to form a single particle. Examples of composite particles include, but are not limited to, core-shell particles and surface-coated particles. In contrast to doped metal oxides, composite inorganic oxide particles consist of more than one phase.

Preferred metal oxide abrasives include, but are not limited to, alumina, ceria, germania, silica, spinel, titania, an oxide or nitride of tungsten, zirconia, or any of the above doped with one or more other minerals or elements, and any combination thereof. The metal oxide abrasive may be produced by any of a variety of techniques, including sol-gel, hydrothermal, hydrolytic, plasma, pyrogenic, aerogel, fuming and precipitation techniques, and any combination thereof.

Precipitated metal oxides and metalloid oxides can be obtained by known processes by reaction of metal salts and acids or other precipitating agents.

Pyrogenic metal oxide and/or metalloid oxide particles are obtained by hydrolysis of a suitable, vaporizable starting material in an oxygen/hydrogen flame. An example is pyrogenic silicon dioxide from silicon tetrachloride. The pyrogenic oxides of aluminum oxide, titanium oxide, zirconium oxide, zirconium silicate, silicon dioxide, cerium oxide, tin oxide, germanium oxide, vanadium oxide, and chemical and physical mixtures thereof are preferred abrasives.

A more preferred abrasive particle comprises cerium oxide (ceria). Examples of abrasive particles comprising cerium oxide include, but are not limited to, calcined ceria, colloidal ceria and ceria coated silica particles. A most preferred abrasive is a composite inorganic oxide composed of ceria coated silica particles.

Ceria coated silica particles comprise amorphous silica particles as core particles and ceria as nanoparticles covering the core as a shell. The surface of each silica particle is covered by ceria nanoparticles. The silica core particles are amorphous, and the ceria nanoparticles are crystalline or more preferably single crystalline. As used herein, single crystalline refers to a continuous crystalline structure.

The quantity of nanoparticles covering the surface of the core particles preferably falls within the following range in terms of the solid weight ratio. The solid weight (b) of the nanoparticles relative to the solid weight (a) of the core particles is (b)/(a)=0.01 to 1.5, more preferably 0.01 to 1.2.

The diameter of the ceria nanoparticles covering the core particle is preferably greater than 10 nanometers, more preferably greater than 13 nanometers. The core particle diameter may range from 15 to 500 nanometers, preferably from 20 to 250 nanometers, most preferably from 50 to 200 nanometers. Preferably, the core particle diameter is greater than diameter of the shell particles. As used herein, the term diameter refers to an absolute diameter of the particles.

In preferred embodiments, the ceria coated silica particles do not disintegrate under polishing forces. Particles that do not break down under the action of polishing forces (i.e. disintegrative forces) and keep the characteristic of original particle size maintain a high removal rate during polishing. If the particles disintegrate under polishing forces, the removal rate will decrease due to an effectively smaller abrasive particle size. Breaking of the particles may also yield irregular shaped particles which may produce the undesirable effect of scratching defects.

Particle stability under disintegrative forces can be determined by subjecting the formulation to ultrasonication treatment for half an hour and measuring the changes in size distribution. Preferred conditions for ultrasonication treatment are a half-hour immersion in a bath with 42 kilohertz frequency at 100 watt output.

Particle size distribution can be measured by using any suitable technique such as Disc Centrifuge (DC) method or Dynamic Light Scattering (DLS). Changes in size distribution can be characterized in terms of changes in mean particle size or D50 (50 percent particles below this size) or D99 (99 percent particles below this size) or any similar parameters. Preferably the changes in particle size distribution of ceria coated silica particles after ultrasonication treatment is less than 10 percent, more preferably less than 5 percent or most preferably less than 2 percent; by using for example DC and mean particle size, D50, D75 and/or D99.

Using such stable particles in CMP slurry formulations allows more effective utilization of polishing forces for film material removal and would also prevent generation of any irregular shapes that would contribute to scratching defects.

In some embodiments, the ceria coated silica particle may also have a thin layer of silicon oxide covering the cerium oxide particles. Without being bound by any particular theory, it is believed that the silicon oxide covering helps stabilize the particle and makes the surface of the particle more negatively charged.

Ceria coated silica particles may be manufactured by any suitable method. Examples of suitable methods of manufacturing are described in following patents which are incorporated herein in their entirety: JP6358899, JP6285775, JP2016084243, US2018105428, JP2017043531, JP2017193692, JP2017206410, JP2017206411, WO18088088, WO18121508, JP2016127139, U.S. Pat. Nos. 9,447,306, 6,645,265, JP5979340, WO2005/035688, US2012/077419, US2003/118824.

Silicon Oxide Removal Rate Accelerators

The CMP slurry formulation may comprise one or more compounds for accelerating the silicon oxide removal rate, referred to herein as silicon oxide removal rate accelerators. Preferred silicon oxide removal rate accelerators are: organic acids having at least one of a sulfonic acid group or a phosphonic acid group, organic acids comprising pyridine functionality, and combinations thereof.

The silicon oxide rate accelerators comprising organic acids having a sulfonic acid group (also referred to herein as sulfonic acids) include but are not limited to aromatic sulfonic acids, aliphatic sulfonic acids, piperazine sulfonic acids, disulfonic acids, aromatic and aliphatic sulfonic acids with amino groups, salts thereof, and combinations thereof. The organic acids having sulfonic acid groups do not include compounds containing a nitrogen atom bonded with hydrogen atoms. The silicon oxide removal rate accelerators comprising sulfonic acid do not include any polymeric or surfactant compounds containing sulfonic acid groups.

Preferred organic acids having a sulfonic acid group include, but are not limited to, methanesulfonic acid, benzenesulfonic acid, toluene sulfonic acid, p-toluene sulfonic acid, ethane disulfonic acid, naphthalene disulfonic acid, acrylamido propane sulfonic acid, morpholinopropanesulfonic acid, 3-(N-Morpholino)propanesulfonic acid (MOPS), 4-Morpholinoethanesulfonic acid (MES), beta-Hydroxy-4-morpholinepropanesulfonic acid (MOPSO), 4-(2-Hydroxyethyl)piperazine-1-ethanesulfonic acid (HEPES), 1,4-piperazinediethanesulfonic acid (PIPES), piperazine-1,4-bis(2-hydroxypropanesulfonic acid)dihydrate (POPSO), 4-(2-Hydroxyethyl)-1-piperazinepropanesulfonic acid (EPPS), piperazinediethane sulfonic acid, and hydroxyethylpiperazine ethane sulfonic acid.

More preferably, the organic acid having a sulfonic acid group is selected from the group consisting of methanesulfonic acid, benzenesulfonic acid, toluene sulfonic acid, p-toluene sulfonic acid, ethane disulfonic acid, naphthalene disulfonic acid, 4-(2-Hydroxyethyl)-1-piperazinepropanesulfonic acid (EPPS), piperazinediethane sulfonic acid, hydroxyethylpiperazine ethane sulfonic acid, and combinations thereof.

In some embodiments, the silicon oxide removal rate accelerator is an organic acid having a phosphonic acid group (also referred to herein as an organic phosphonic acid), including, but not limited to, substituted phosphonic acids with a general formula of R—P(O)(OH)$_2$; where R can be any substituent moiety except hydrogen. These embodiments include the corresponding phosphonic acid salts, combinations thereof and combinations of acids and slats. Preferred organic phosphonic acids are phenyl phosphonic acid, linear alkyl phosphonic acids with the general formula CH$_3$—(CH$_2$)$_n$—P(O)(OH)$_2$; where n ranges from 1 to 25. More preferred organic phosphonic acids are, phenyl phosphonic acid, phenyl phosphinic acid.

In some embodiments, the silicon oxide removal rate accelerator is a pyridine compound including, but is not limited to, 2-pyridinecarboxylic acid, 3-pyridinecarboxylic acid, 4-pyridinecarboxylic acid, pyridine, pyridine-2,6-dicarboxylic acid, 2,2-bipyridine.

In some embodiments, the silicon oxide removal rate accelerator comprises a pyridine compound substituted with one or more carboxylic acid groups having a structure of Formula (I):

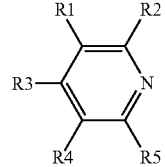

Formula (I)

wherein R1, R2, R3, R4 and R5 are independently selected from group consisting of hydrogen, carboxylic acid, carboxylic acid ester, organic sulfonic acid, organic amine, organic amide, hydroxyl group.

In preferred embodiments, the pyridine compound comprises at least one of the selected R group as carboxylic acid. Preferred pyridine compounds include but are not limited to: 2-pyridine carboxylic acid; 3-pyridinecarboxylic acid; 4-pyridinecarboxylic acid; pyridine; pyridine-2,6-dicarboxylic acid; 2,2-bipyridine and combinations thereof.

Preferred pyridine compounds and derivatives used in the CMP polishing compositions also include, but are not limited to pyridine, pyridine monocarboxylic acid, or pyridine dicarboxylic acid, such as picolinic acid, nicotinic acid, isonicotinic acid, dipicolinic acid, 2,5-pyridinedicarboxylic acid, 3,5-pyridinedicarboxylic acid, 2,3-pyridinedicarboxylic acid, and 3,4-pyridinedicarboxylic acid.

Preferred silicon oxide removal rate accelerators include, but are not limited to, benzene sulfonic acid, toluene sulfonic acid, acetic acid, phenyl phosphonic acid, phenyl phosphinic acid and 2-pyridinecarboxylic acid.

Preferably, the concentration of silicon oxide removal rate accelerator ranges from about 0.001 weight percent to 10 weight percent relative to the total weight of the CMP composition. More preferably the range is from about 0.01 weight percent to 8 weight percent. Most preferably, the range is from about 0.1 weight percent to 5 weight percent.

Solvent

The solvent may be water, one or more polar solvents, or a combination thereof. A preferred solvent is water.

Formulation of the CMP Slurry and Physical Characteristics

The CMP composition comprises abrasive particles, silicon oxide removal rate accelerators, and a solvent. Optionally, a pH adjusting agent is used to adjust pH of the CMP composition to the optimized pH condition. Other optional ingredients may also be present as described below.

The abrasive particles are present in an amount from 0.01 weight percent to 20 weight percent, preferably, from 1 weight percent to 10 weight percent, more preferably, from about 3 weight percent to about 8 weight percent, based on the total weight of the CMP composition.

Preferably, the pH of the CMP composition is greater than 5, more preferably greater than 7. This pH range is less corrosive compared to acidic pH slurries and would lead to lower pad and conditioning disk wear. Silicon oxide removal rates are also maximized in this pH range. The pH may be adjusted using suitable pH adjusters.

In a preferred embodiment, the CMP formulation comprises a composite ceria abrasive (ceria coated silica), and a salt (nitrate, phosphate, sulphate) or combined salts or corresponding acid (nitric, sulfonic, sulfuric, phosphonic, phosphinic) or combined acids or other acid (carboxylic) with pH 7-11 (adjusted by suitable acid/base such as HNO3/NH4OH) and conductivity 0.3-9 millisiemens per centimeter.

In another preferred embodiment, the formulation is made with a composite ceria abrasive that is ceria coated silica (0.1-6 weight percent), and BSA/phenyl phosphonic acid/phenyl phosphinic acid (up to 2.5 weight percent) with pH 7-11 (adjusted by suitable acid/base such as HNO3/NH4OH) and conductivity 0.3-6 millisiemens per centimeter.

Preferably, the electrical conductivity of the slurry measured at 25 degrees Celsius is between 0.1 to 20 millisiemens per centimeter, more preferably between 0.5 and 10 millisiemens per centimeter and most preferably between 1 and 5 millisiemens per centimeter. The conductivity may be adjusted by using a conductivity adjusting additive.

In order to provide a stable slurry, the abrasive particles must have sufficiently negative or positive zeta potential at the point of use and in the concentrated polishing compositions. Zeta potential may be measured by any suitable techniques including or not limited to streaming potential/current measurements, electrophoretic velocity measurement, and electroacoustic techniques.

Zeta potential of the abrasive particles in the slurry is preferably more negative than −25 millivolts or more positive than +25 millivolts, more preferably more negative than −30 millivolts or more positive than +30 millivolts and most preferably more negative than −35 millivolts or more positive than +35 millivolts, as measured using electroacoustic zeta potential measurement techniques.

Without being beholden to any particular theory, it is hypothesized that the sulfonic acid (or phosphonic acid or phosphinic acid) is able to reduce oxides in ceria to make more Ce(III) available to increase the polishing rates of silicon oxide.

Higher oxide removal rates and highly selective oxide to nitride removal have been achieved by slurries using calcined CeO2 abrasive in an acidic pH range from 3.5 to 5.5. Using such slurries, it has been demonstrated that higher oxide removal rates are accompanied by higher Ce3+ active sites formed on the CeO2 abrasives. In terms of charge interaction, CeO2 abrasives would be charged positively (Isoelectric Point (IEP) approximately 6 to 7) and oxide substrate charged negatively (IEP approximately 2 to 3) in the acidic slurry (pH 4-6). A lower oxide removal rate would be expected during polishing in an alkaline pH from 8 to 10, not only due to repulsive charge interaction between the calcined CeO2 particles and the oxide substrate, but the Ce3+ active sites on the CeO2 abrasive are "neutralized" by hydroxide ions.

In some embodiments, composite ceria abrasives are formulated with a SiO2 core which is covered with fine Ce abrasives as the shell. The terms "composite ceria abrasive" and "ceria coated silica" are used interchangeably in the disclosure and claims to refer to this embodiment The surface charge on this composite abrasive is highly negatively charged in an environment with a pH from 2 to 10, so there would be a repulsive coulomb's force between the composite ceria abrasive and the oxide substrate, resulting in lower oxide removal rates. By introducing a salt or acid into the slurry, thereby increasing the slurry's conductivity, the negative charge on both abrasive and oxide substrate is effectively neutralized, boosting oxide removal rates.

Advanced CMP applications require extremely low levels of metals such as sodium on the dielectric surface after polishing. Therefore, it is desired to have very low trace metals, especially sodium, in the slurry formulations. In embodiments, the formulations comprising ceria coated silica particles that have less than 5 ppm, more preferably less than 1 ppm, most preferably less than 0.5 ppm of sodium impurity levels for each percent of abrasive particles in the formulations by weight.

Optional Functional Additives

CMP slurry formulations may comprise optional functional additives to perform various functions including, but not limited to, modifying removal rate selectivity between silicon oxide films and some other films such as silicon nitride or polysilicon, boosting removal rates, adjusting within wafer non-uniformity.

The compositions optionally include additives selected from a group consisting of additives for removal rate selectivity, pH adjusters, conductivity adjustors, surfactants, dispersants, biological growth inhibitors, and combinations thereof.

Additives for Removal Rate Selectivity

Additives affecting removal rate selectivity include, but are not limited to, additives having a functional group selected from the group consisting of organic carboxylic acids, amino acids, amidocarboxylic acids, N-acylamino acids, and their salts thereof; organic sulfonic acids and salts thereof; organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, and combinations thereof;

Chemical additives affecting removal rate selectivity include, but is not limited to a compound having a functional group selected from the group consisting of organic carboxylic acids, amino acids, amidocarboxylic acids, N-acylamino acids, and their salts thereof; organic sulfonic acids and salts thereof; organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, and combinations thereof.

Preferred chemical additives affecting removal rate selectivity include, but are not limited to, polyacrylic acid or its derivatives; and polyethylene glycol, polyol comprising hydroxyl groups such as sorbitol, galactose, arabinose, ribose, xylose, maltitol, lactose, maltose and mixtures thereof. Preferred molecular weight of polyacrylic acid compound is between 500 and 100,000, or more preferably between 1,000 and 50,000 and most preferably between 5,000 and 20,000. Polyethylene glycol molecular weight can range from 1,000 to 20,000, and more preferably between 5,000 and 15,000.

When present, the amount of chemical additive ranges from about 0.01 weight percent to 2 weight percent relative to the total weight of the CMP composition. The preferred range is from about 0.05 weight percent to 1 weight percent and more preferred range is from about 0.1 weight percent ppm to 0.5 weight percent.

pH Adjustors

The pH of the composition may be adjusted using an appropriate pH adjusting agent, such as a suitable acid, base, amine, or any combination thereof. Preferably, a pH adjusting agent used in the composition does not contain metal ions, such that undesirable metal components are not introduced into the composition.

Preferred agents for adjusting pH include, but are not limited to, sodium hydroxide, cesium hydroxide, potassium hydroxide, cesium hydroxide, ammonium hydroxide, quaternary organic ammonium hydroxide (e.g. tetramethylammonium hydroxide), nitric acid, phosphoric acid, sulfuric acid, organic acids, and/or salts thereof, amines, and mixtures thereof.

When present, the amount of pH-adjusting agent ranges from about 0.0001 to about 5 weight percent relative to the total weight of the CMP composition. The preferred range is from about 0.0005 to about 1 weight percent, and the more preferred range is from about 0.0005 to about 0.5 weight percent Preferably, the pH of the CMP composition is greater than 5, more preferably greater than 7.

Conductivity Adjustors

The CMP composition may contain additives to adjust the conductivity of the formulation. A preferred conductivity adjustor is potassium nitrate.

Surfactants

The CMP composition may comprise a surfactant or a mixture of surfactants. Surfactants may be anionic, cationic, nonionic or zwitterionic in nature. While there are many suitable surfactant additives for the slurry, preferred surfactant additives include dodecyl sulfate sodium salt, sodium lauryl sulfate, dodecyl sulfate ammonium salt, alcohol ethoxylates, acetylenic surfactant, polyethyleneimine, ethoxylated fatty amine and stearylbenzyldimethylammonium chloride or nitrate and any combination thereof. Suitable commercially available surfactants include TRITON DF 16™ manufactured by Dow Chemicals and various surfactants in SUIRFYNOL™, DYNOL™, Zetasperse™, Nonidet™, and Tomadol™ surfactant families, manufactured by Evonik Industries.

Various anionic, cationic, nonionic and zwitterionic surfactants having molecular weight in the range from less than 1000 to greater than 30,000 are contemplated as dispersants. Included are sodium, potassium, or preferably ammonia salts of stearate, lauryl sulfate, alkyl polyphosphate, dodecyl benzene sulfonate, diisopropyl naphthalene sulfonate, dioctylsulfosuccinate, ethoxylated and sulfated lauryl alcohol, and ethoxylated and sulfated alkyl phenol.

Various cationic surfactants include polyethyleneimine, ethoxylated fatty amine and stearylbenzyldimethylammonium chloride or nitrate.

Addition of a surfactant may be useful to reduce the within-wafer-non-uniformity (WIWNU) of the wafers, thereby improving the surface of the wafer and reducing wafer defects.

The CMP composition may comprise a dispersing additive to stabilize particle dispersion.

When present, the amount of surfactant ranges from about 0.0001 to about 10 weight percent relative to the total weight of the CMP composition. The preferred range is from about 0.001 to about 1 weight percent, and more preferred range is from about 0.005 to about 0.1 weight percent.

Dispersants

The suitable dispersing additive includes but is not limited to organic acids and their salts; polymeric acids and their salts; water soluble copolymers and their salts; copolymers and their salts containing at least two different types of acid groups, such as carboxylic acid groups, sulfonic acid groups, or phosphonic acid groups in the same molecule of a copolymer, polyvinyl acid and salt thereof, polyethylene oxide, polypropylene oxide, and combinations thereof. Some examples of dispersants include: polyethylene glycols; lecithin; polyvinyl pyrrolidone; polyoxyethylene; isoctylphenyl ether; polyoxyethylene nonylphenyl ether; amine salts of alkylaryl sulfonates; polyacrylic acid, polymethacrylic acid and their salts.

When present, the amount of dispersant ranges from about 0.0001 weight percent to about 10 weight percent relative to the total weight of the CMP composition. The preferred range is from about 0.001 to about 1 weight percent, and more preferred range is from about 0.005 weight percent to about 0.1 weight percent.

Formulations may also comprise water soluble polymers which may comprise anionic or cationic or non-ionic or zwitterionic combinations of groups.

Biological Growth Inhibitors

CMP formulations may also comprise additives to control biological growth such as biocides. Some of the additives to control biological growth are disclosed in U.S. Pat. No. 5,230,833 (Romberger et al.) and US Patent Application No. US 20020025762. Biological growth inhibitors include but are not limited to tetramethylammonium chloride, tetraethylammonium chloride, tetrapropylammonium chloride, alkylbenzyldimethylammonium chloride, and alkylbenzyldimethylammonium hydroxide, wherein the alkyl chain ranges from 1 to about 20 carbon atoms, sodium chlorite, sodium hypochlorite, isothiazolinone compounds such as methylisothiazolinone, methylchloroisothiazolinone and benzisothiazolinone. Some of the commercially available preservatives include BIOBAN™ 425, KATHON™ and NEOLONE™ product families from Dow Chemicals and Preventol™ family from Lanxess.

The preferred biocides are isothiozilone compounds such as methylisothiazolinone, methylchloroisothiazolinone and benzisothiazolinone. The CMP polishing compositions optionally contain a biocide ranging from 0.0001 to 0.10 weight percent, preferably from 0.0001 to 0.005 weight percent, and more preferably from 0.0002 to 0.0025 weight percent to prevent bacterial and fungal growth during storage.

Methods of Use

In one exemplary embodiment, a system for chemical mechanical planarization comprises a patterned substrate comprising at least one surface having a first material and a second material, a polishing pad; and the polishing composition described above. The at least one surface is in contact with the polishing pad and the polishing composition. The first material is a silicon oxide material selected from the group consisting of thermal oxide, TEOS films deposited using Tetra Ethyl Ortho Silicate (TEOS) precursors, High Density Plasma (HDP) oxide, High Aspect Ratio Process (HARP) films, fluorinated oxide films, doped oxide films, Spin-On Glass (SOG), flowable Chemical Vapor Deposited (CVD) films, optical glass, display glass, and combinations thereof. As used herein, doped oxide films include, but are not limited to, oxide films that are fluorine doped, carbon doped, boron doped, phosphorus doped, nitrogen-doped or combinations of thereof.

In an exemplary embodiment, a polishing method for chemical mechanical planarization of a semiconductor device comprises at least one surface having a first material and a second material. The method comprises the steps of: contacting the at least one surface with a polishing pad; delivering the polishing composition described above to the at least one surface, polishing the at least one surface with the polishing composition to remove the first material at a removal rate of greater than 10000 Angstroms/min., preferably greater than 12500 Angstroms/min., more preferably greater than 15000 Angstroms/min.

The first material is a silicon oxide material selected from the group consisting of thermal oxide, TEOS films deposited using Tetra Ethyl Ortho Silicate (TEOS) precursors, High Density Plasma (HDP) oxide, High Aspect Ratio Process (HARP) films, fluorinated oxide films, doped oxide films, Spin-On Glass (SOG), flowable Chemical Vapor Deposited (CVD) films, optical glass, display glass, and combinations thereof.

Silicon oxide films may be generally referred to as oxide films in the description. Silicon oxide films could include variety of films and materials including but not limited to thermal oxide, films deposited using Tetra Ethyl Ortho Silicate (TEOS) precursors, High Density Plasma (HDP) oxide, High Aspect Ratio Process (HARP) films, fluorinated oxide films, doped oxide films, Spin-On Glass (SOG), flowable Chemical Vapor Deposited (CVD) films, optical glass, display glass. As used herein, doped oxide films include, but are not limited to, oxide films that are fluorine doped, carbon doped, boron doped, phosphorus doped, nitrogen-doped or combinations of thereof.

In some embodiments, the CMP formulations can be used in stop-in-film applications, where the polishing is stopped once the topography is removed and a flat surface is achieved. In other embodiments, these formulations can be used in applications that involve polishing the bulk film and stopping at a stopper layer. The stopping layer may comprise a silicon nitride or poly-Si film. Silicon nitride film may be represented by a general formula $Si_xN_y$, where the ratio x/y may range from 0.1 to 10. The silicon nitride may also incorporate other elements such as but not limited to oxygen, carbon, nitrogen.

In preferred embodiments, the silicon oxide films are polished at a rate greater than 10000 Å/min, or more preferably more than 12000 Å/min or most preferable greater than 15000 Å/min when the blanket films are polished at 4 psi downforce and 126 RPM table speed with 150 ml/min slurry flow rate on a 300 mm wafer polisher. In some other embodiments removal rate selectivity between the oxide and the stopper film greater than 10, or more preferably greater than 30.

One skilled in the art will understand that the slurry can be used with regular or fixed abrasive pads, can be shipped as concentrate, can be single or multi-component pack, and in case of multi-component pack, can be used in in-situ or ex-situ mixing mode.

WORKING EXAMPLES

Parameters:

Å: angstrom(s)—a unit of length
BP: back pressure, in psi units
CMP: chemical mechanical planarization=chemical mechanical polishing
CS: carrier speed
DF: Down force: pressure applied during CMP, units psi
min: minute(s)
ml: milliliter(s)
mV: millivolt(s)
psi: pounds per square inch
PS: platen rotational speed or table-speed of polishing tool, in rpm (revolution(s) per minute)
SF: polishing composition flow, ml/min
Removal Rates and Selectivity
Removal Rate (RR)=(film thickness before polishing−film thickness after polishing)/polish time.

All percentages are weight percentages (weight percent) unless otherwise indicated.

General Experimental Procedure

In the examples presented below, CMP experiments were run using the procedures and experimental conditions given below. The 300 mm CMP tool that was used in the examples is a Reflexion LK®, manufactured by Applied Materials, 3050 Boweres Avenue, Santa Clara, Calif., 95054. IC1010 pads, IK4250UH pads, and IK4131 UH pads from Dow Chemicals were used for polishing. TEOS oxide films were made by Chemical Vapor Deposition (CVD) using tetraethylorthosilicate as the precursor. HDP oxide films were made using a high-density plasma (HDP) technique.

All the 300 mm wafer polishing was performed at 4 psi downforce, 126 RPM table speed, 125 RPM carrier speed, 150 ml/min slurry flow rate and using 30% in-situ conditioning (3MA122 disk) with 6 lb force and 115 rpm speed. All the 200 mm wafer polishing was performed on 200 mm Ebara tool with IC1010 pad at 4 psi downforce, 100 RPM table speed, 107 RPM carrier speed, 300 ml/min slurry flow rate and 17 s ex-situ conditioning (disk Kinik PDE781-NC) at 4 psi and 20 RPM table speed after each polish.

TEOS film thickness was 15,000 Å or 40,000 Å. HDP film thickness was 10,000 Å. Ceria coated silica particles used in the examples below were procured from JGC C&C Ltd (Kawasaki City, Japan). Mean particle size of these particles measured by Disc Centrifuge analysis method (DC24000 UHR from CPS Instruments) was 155 nm.

Slurry Conductivity was measured with a EUTECH Con 110. Zeta potential was measured using a Colloidal Dynamics Zeta Potential Probe. Ceria particle density and dielectric constant values were used as surrogates for the composite particle's parameters in the calculations. Therefore, the zeta potential numbers given in the examples are to be interpreted only for relative comparison.

Example 1

The CMP compositions comprised ceria coated silica particles at 4 weight percent concentration and benzene sulfonic acid at various concentrations. Table 1 summarizes the compositions and the removal rates for TEOS films. Formulations were pH adjusted using ammonium hydroxide.

TABLE 1

| Formulation # | Ceria Coated Silica (weight percent) | Benzene Sulfonic Acid (weight percent) | pH | Electrical Conductivity of Slurry (mS/cm) | TEOS Removal Rate | Zeta potential (mV) |
| --- | --- | --- | --- | --- | --- | --- |
| 1 | 4 | 0 | 9.0 | 0.055 | 11516 | −59.62 |
| 2 | 4 | 0.5 | 7.5 | 3.3 | 16381 | −42.99 |
| 3 | 4 | 1.5 | 7.5 | 9.1 | 15891 | −24.56 |

It is evident that benzene sulfonic acid provides significant removal rate boost for TEOS films. Formulation 3 was found to unstable, leading to settling of the particles. It is evident that a zeta potential of at least −30 millivolts or more negative, preferably more than −35 millivolts may be needed to achieve a stable slurry.

Example 2A

CMP compositions comprising ceria coated silica particles at 4 weight percent concentration and 2 weight percent MOPS were formulated at different pH using ammonium hydroxide as pH adjuster. Table 2A summarizes the removal rates for TEOS films as a function of pH. The results show that pH greater than 6 or 7 may be more optimal for increased removal rates.

TABLE 2A

| pH | TEOS Removal Rate (Å/min) |
| --- | --- |
| 5.5 | 11610 |
| 7.5 | 15390 |
| 9 | 14079 |

Example 2B

CMP compositions comprising ceria coated silica particles at 2 weight percent concentration were formulated at different pH using ammonium hydroxide as pH adjuster or potassium nitrate as conductivity adjuster. Table 2B summarizes the removal rates for TEOS films as a function of pH, taken on the 200 mm tool. The results show that higher pH suitable for high rate for the slurries. At the same pH, higher conductivity is suitable for higher TEOS removal rates.

TABLE 2B

| pH | pH adjuster/conductivity adjustor | Conductivity (mS/cm) | TEOS Removal Rate (Å/min) |
| --- | --- | --- | --- |
| 11 | NH4OH only | 0.308 | 13506 |
| 10 | NH4OH only | 0.06 | 11545 |
| 9 | None | <0.05 | 7771 |
| 9 | KNO3, NH4OH | 1.5 | 15836 |
| 9 | KNO3, NH4OH | 7.0 | 17336 |

Example 3

CMP slurry compositions were prepared comprising ceria coated silica particles at 4 weight percent concentration and picolinic acid at 0.1 weight percent. The compositions also comprised different concentrations of MOPS additive. The pH of the slurry formulation was adjusted to 7.5 using ammonium hydroxide as pH adjuster. The data was generated using a 300 mm tool.

TABLE 3

| MOPS Additive Concentration | TEOS Removal Rate (Å/min) | Electrical Conductivity (mS/cm) | Zeta Potential (mV) |
| --- | --- | --- | --- |
| 0.5 | 15933 | 1.448 | −52.31 |
| 1.5 | 15730 | 4.18 | −41.22 |
| 2 | 15390 | 5.72 | −37.88 |
| 2.5 | 16305 | 6.66 | −35.08 |

Table 3 summarizes the 300 mm TEOS removal rate data as a function of MOPS concentration. It shows that high removal rates can be maintained across a wide range of additive concentration. In contrast, in experiments with formulations containing no MOPS additive, the TEOS removal rate is in the range of 11000-12000 Angstroms/minute.

Example 4

Slurries were prepared comprising 3% composite ceria abrasive (ceria coated silica) at pH 9. NH4OH was used to adjust the pH of the slurries. Carboxylic acids, phosphonic and phosphinic acids were added to the compositions according to Table 4 below, and the slurries were tested boost provided to the TEOS removal rate, as reported in Table 4. All the wafer polishing was performed on 200 mm Ebara tool.

TABLE 4

| Additive Name | Additive Level (wt. %) | Electrical Conductivity (mS/cm) | TEOS Removal Rate (Å/min) |
|---|---|---|---|
| None | 0 | .052 | 11792 |
| Phenylphosphonic acid | 0.1 | 1.30 | 16268 |
| Phenylphosphinic acid | 0.2 | 1.25 | 17081 |
| Benzoic acid | 0.15 | 1.23 | 17144 |
| Benzoic acid | 0.07 | 0.66 | 16556 |
| Acetic acid | 0.08 | 1.33 | 17368 |
| Malonic Acid | 0.13 | 2.07 | 16824 |
| Glutaric Acid | 0.166 | 3.44 | 16336 |
| Oxalic Acid | 0.113 | 1.29 | 15055 |

It is seen from Table 4, that the compared to the control sample, all the additives increase the conductivity of the slurry and also increase the oxide removal rate. Without being bound to a particular theory, slurry conductivity is an important parameter for increasing oxide removal rate.

Example 5

A 4 percent by weight composite ceria (ceria coated silica) abrasive formulation, with pH adjusted to 9, with varying levels of BSA rate booster were prepared and tested for RR in a 300 mm tool. The same ceria-based slurries were also diluted down to solid content of 0.008 weight percent for suitable absorption. A high-resolution UV/Vis spectrophotometer, JASCO V-550, was used to measure the absorption spectra of the filtrates in the 200-500 nm wavelength region. The subject ceria abrasive has two characteristic absorption peak 211 and 311 nm which mean Ce3+ and Ce4+ absorption respectively. The peak area of Ce 3+ was characterized after normalizing to the Ce4+ peak area (245-500 nm); and also after subtracting the background from the additive alone. The results are summarized in Table 5. It is expected that formulations with a higher Ce3+ fraction will increase the TEOS removal rate. When glycine (2-aminoethanoic acid) was used as the additive, no oxide rate boost was seen and correspondingly, no increase was seen in the Ce3+ peak area. Without being bound by any particular theory, the additives of the invention are also expected to increase the Ce3+ fraction of the abrasive, and therefore boost the TEOS removal rate.

TABLE 5

| Additive | Level (weight %) | pH | Conductivity (mS/cm) | % Change in Ce3+/Ce4+ ratio | TEOS RR (A/min) |
|---|---|---|---|---|---|
| BSA | 0.5 | 7.5 | 3.3 | +2.58 | 16380 |
| BSA | 0.5 | 9 | 3.3 | Not done | 14604 |
| Glycine | 0.5 | 9 | 0.12 | −0.78 | 10870 |

Example 6

A CMP Slurry was prepared having a pH of 9, 4 percent by weigh of composite ceria (ceria coated silica) abrasive and 0.5 percent by weight of BSA additive were prepared. Table 6 summarizes the polish rate on a 300 mm Reflexion LK tool for TEOS oxide and HARP (High Aspect Ratio Process) oxide films with two types of pads (IC1010 and IK4250 UH). As seen from Table 6, the exact polish rate depends on the type of film, and also type of pad. High rates of greater 2.5 microns/min can be achieved.

TABLE 6

| 300 mm pad polish rate A/min | IC1010 pad | IK4250UH pad |
|---|---|---|
| TEOS oxide | 16381 | 20854 |
| HARP oxide | 19125 | 25501 |

Example 7

A calcined ceria abrasive and composite ceria abrasive (ceria coated silica) were compared in slurries comprising 3 percent by weight of abrasive. The properties of the slurries and corresponding 300 mm TEOS film RR values are listed in Table 7. The RR values were obtained using two different pads at the same process conditions (3MA122 disk, baseline polish recipe as given above for 300 mm wafers). The composite ceria abrasive is clearly better for obtaining higher TEOS removal rates, even at the same abrasive level.

TABLE 7

| Properties (3% abrasive slurry) | Calcined ceria abrasive slurry | Composite ceria abrasive slurry |
|---|---|---|
| pH | 9.74 | 9.11 |
| Conductivity (micro S/cm) | 72 | 49 |
| Zeta Potential (mV) | −74 | −62 |
| IC1010 Pad, Oxide RR (A/min) | 8185 | 10367 |
| IK4131UH Pad, Oxide RR (A/min) | 10197 | 14306 |

The foregoing examples and description of the embodiments should be taken as illustrating, rather than as limiting the present invention as defined by the claims. As will be readily appreciated, numerous variations and combinations of the features set forth above can be utilized without departing from the present invention as set forth in the claims. Such variations are intended to be included within the scope of the following claims.

The invention claimed is:

1. A chemical mechanical planarization (CMP) composition for polishing oxide material consisting essentially of:
    an abrasive selected from the group consisting of calcined ceria, colloidal ceria, ceria coated silica particles, and combinations thereof;
    a removal rate accelerator having a pyridine group, wherein the pyridine group has a structure of:

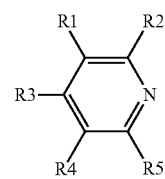

wherein R1, R2, R3, R4 and R5 are independently selected from the group consisting of hydrogen, a carboxylic acid, a carboxylic acid ester, an organic sulfonic acid, an organic amine, an organic amide and a hydroxyl group;

and
a solvent, and
optionally at least one additive selected from the groups consisting of
an additive for removal rate selectivity selected from the group consisting of sorbitol, galactose, arabinose, ribose, xylose, maltitol, lactose, maltose and combinations thereof;
a pH adjuster selected from the group consisting of sodium hydroxide; cesium hydroxide; potassium hydroxide; ammonium hydroxide; quaternary organic ammonium hydroxide; nitric acid; phosphoric acid; sulfuric acid; and combinations thereof;
a surfactant selected from the group consisting of dodecyl sulfate sodium salt, dodecyl sulfate ammonium salt, alcohol ethoxylates, acetylenic surfactant, stearylbenzyldimethylammonium chloride or nitrate, and combination thereof;
a dispersant selected from the group consisting of lecithin; isoctylphenyl ether;
amine salts of alkylaryl sulfonates; and combinations thereof;
and
a biological growth inhibitor is selected from the group consisting of tetramethylammonium chloride; tetraethylammonium chloride;
tetrapropylammonium chloride; alkylbenzyldimethylammonium chloride or alkylbenzyldimethylammonium hydroxide, wherein the alkyl chain ranges from 1 to about 20 carbon atoms; sodium chlorite; sodium hypochlorite;
methylisothiazolinone; methylchloroisothiazolinone; benzisothiazolinone; and combinations thereof;
wherein the composition has a pH greater than 7; and
the abrasive comprises particles having a zeta potential more negative than −25 millivolts.

2. The CMP composition of claim 1, wherein the abrasive comprises ceria coated silica particles, the ceria coated silica particles comprising an amorphous silica core particle coated with crystalline ceria nanoparticles.

3. The CMP composition of claim 2, wherein the crystalline ceria nanoparticles comprise a single crystal.

4. The CMP composition of claim 2, wherein a weight ratio of the ceria nanoparticles to the amorphous silica core particle is 0.01 to 1.5.

5. The CMP composition of claim 2, wherein the amorphous silica core particles comprise a diameter ranging from 20 to 550 nanometers and the ceria nanoparticles comprise a diameter greater than 10 nanometers, wherein the diameter of the amorphous silica core particles is greater than the diameter of the ceria nanoparticles.

6. The CMP composition of claim 1, wherein the solvent is selected from the group consisting of water, a polar non-aqueous solvent, and a mixture thereof.

7. The CMP composition of claim 6, wherein the non-aqueous solvent is selected from the group consisting of alcohol, ether, ketone and combinations thereof.

8. The CMP composition of claim 1, wherein at least one of R1, R2, R3, R4 and R5 is a carboxylic acid.

9. The CMP composition of claim 1, wherein the removal rate accelerator is pyridine, or an organic acid having a pyridine group selected from the group consisting of: pyridine monocarboxylic acid; pyridine dicarboxylic acid; picolinic acid; nicotinic acid; isonicotinic acid; dipicolinic acid; 2,5-pyridinedicarboxylic acid; 3,5-pyridinedicarboxylic acid; 2,3-pyridinedicarboxylic acid; and 3,4-pyridinedicarboxylic acid.

10. The CMP composition of claim 1, wherein a pH of the CMP composition ranges up to 11.

11. The CMP composition of claim 1, wherein a conductivity of the CMP composition ranges from 0.3 to 9 millisiemens per centimeter.

12. A polishing method for chemical mechanical planarization (CMP) of a semiconductor device comprising a first material and a second material, comprising the steps of:
(a) contacting at least one surface of the first material with a CMP polishing pad;
(b) delivering the CMP polishing composition of claim 1 to the at least one surface;
(c) polishing the at least one surface with the polishing composition to remove the first material at a removal rate of greater than 10000 Angstroms/minute.

13. The polishing method of claim 12, wherein the first material is a silicon oxide material selected from the group consisting of thermal oxide, TEOS films deposited using Tetra Ethyl Ortho Silicate (TEOS) precursors, High Density Plasma (HDP) oxide, High Aspect Ratio Process (HARP) films, fluorinated oxide films, doped oxide films, Spin-On Glass (SOG), flowable Chemical Vapor Deposited (CVD) films, optical glass, display glass, and combinations thereof.

14. The polishing method of claim 13, wherein the second material is selected from the group of silicon nitride, polysilicon, and combinations thereof.

15. A system for chemical mechanical planarization, comprising:
(a) a patterned substrate comprising at least one surface having a first material and a second material;
(b) a polishing pad; and
(c) the CMP polishing composition of claim 1,
wherein the at least one surface is in contact with the polishing pad and the polishing composition and the first material is a silicon oxide material selected from the group consisting of thermal oxide, TEOS films deposited using Tetra Ethyl Ortho Silicate (TEOS) precursors, High Density Plasma (HDP) oxide, High Aspect Ratio Process (HARP) films, fluorinated oxide films, doped oxide films, Spin-On Glass (SOG), flowable Chemical Vapor Deposited (CVD) films, optical glass, display glass, and combinations thereof.

* * * * *